(12) United States Patent
Murata

(10) Patent No.: US 10,157,931 B2
(45) Date of Patent: Dec. 18, 2018

(54) SEMICONDUCTOR MEMORY AND SEMICONDUCTOR MEMORY MANUFACTURING METHOD

(71) Applicant: LAPIS SEMICONDUCTOR CO., LTD., Kanagawa (JP)

(72) Inventor: Nobukazu Murata, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/706,206

(22) Filed: Sep. 15, 2017

(65) Prior Publication Data

US 2018/0083023 A1 Mar. 22, 2018

(30) Foreign Application Priority Data

Sep. 21, 2016 (JP) .................. 2016-184438

(51) Int. Cl.

| | | |
|---|---|---|
| H01L 27/108 | (2006.01) | |
| H01L 29/76 | (2006.01) | |
| H01L 27/11558 | (2017.01) | |
| H01L 21/3215 | (2006.01) | |
| H01L 27/11521 | (2017.01) | |
| H01L 29/06 | (2006.01) | |
| H01L 29/10 | (2006.01) | |
| H01L 29/66 | (2006.01) | |
| H01L 29/788 | (2006.01) | |

(Continued)

(52) U.S. Cl.
CPC .. *H01L 27/11558* (2013.01); *H01L 21/32155* (2013.01); *H01L 27/11521* (2013.01); *H01L 29/0684* (2013.01); *H01L 29/1095* (2013.01); *H01L 29/66825* (2013.01); *H01L 29/7883* (2013.01); *H01L 29/94* (2013.01); *H01L 21/02164* (2013.01); *H01L 21/02532* (2013.01); *H01L 21/02595* (2013.01)

(58) Field of Classification Search
CPC ... H01L 28/40; H01L 29/94; H01L 27/11526; H01L 27/11531; H01L 27/11565; H01L 27/1211
USPC .......................................................... 257/306
See application file for complete search history.

(56) References Cited

U.S. PATENT DOCUMENTS

| | | | |
|---|---|---|---|
| 5,911,105 A * | 6/1999 | Sasaki | H01L 27/105 257/E21.689 |
| 6,788,574 B1 | 9/2004 | Han et al. | |
| 2007/0121381 A1* | 5/2007 | Kalnitsky | G11C 16/0433 365/185.18 |

FOREIGN PATENT DOCUMENTS

JP        2007110073 A     4/2007

* cited by examiner

*Primary Examiner* — Theresa T Doan
(74) *Attorney, Agent, or Firm* — Volentine, Whitt & Francos, PLLC

(57) ABSTRACT

The present disclosure provides a semiconductor memory including a first capacitor, a second capacitor, and a transistor. The first capacitor includes a first conductive layer provided on a surface of an n-well, n-type diffusion layers provided in a surface layer portion of the n-well, and a p-type diffusion layer provided in the surface layer portion of the n-well so as to be adjacent to the first conductive layer and separated from the n-type diffusion layers. The second capacitor includes a second conductive layer provided on a surface of an n-well, n-type diffusion layers provided in a surface layer portion of the n-well, and a p-type diffusion layer provided in the surface layer portion of the n-well so as to be adjacent to the second conductive layer and separated from the n-type diffusion layers.

8 Claims, 17 Drawing Sheets

(51) Int. Cl.
*H01L 29/94* (2006.01)
*H01L 21/02* (2006.01)

SEMICONDUCTOR MEMORY AND SEMICONDUCTOR MEMORY MANUFACTURING METHOD

CROSS-REFERENCE TO RELATED APPLICATION

This application claims priority under 35 USC 119 from Japanese Patent Application No. 2016-184438, filed on Sep. 21, 2016, the disclosure of which is incorporated by reference herein.

BACKGROUND

Technical Field

The present disclosure relates to a semiconductor memory and a semiconductor memory manufacturing method.

Related Art

EEPROM (electrically erasable programmable read-only memory), whose stored data can be erased electrically, is known as a type of non-volatile semiconductor memory. EEPROMs includes an electrically insulated floating electrode layers known as floating gates. The EEPROMs function as memory by changing charge storage states in the floating gates.

In general EEPROMs, each floating gate is implemented by a dedicated electrode layer that is distinct from a memory cell gate (a control gate). For example, a polysilicon layer configuring a floating gate and a polysilicon layer configuring a control gate are typically disposed so as to overlap with each other in a stacked arrangement.

On the other hand, EEPROMs in which a floating gate and a control gate are configured by a single layer of a polysilicon film, are also known. In this type of EEPROM, although the surface area per memory cell may increase, low cost manufacturing may be possible. Accordingly, for EEPROMs with comparatively low storage capacities, the adoption of memory cells having a single layer-polysilicon structure is advantageous from a cost perspective.

As an example of technology related to a semiconductor memory in which a floating gate and a control gate are configured by a single layer of a polysilicon film, U.S. Pat. No. 6,788,574 discloses an integrated circuit including a non-volatile memory that includes: a coupling capacitor having a first plate that functions as a first gate and a second plate formed by a $P^+$ doped region in contact with an $N^+$ doped region; a read transistor having a second gate; and a tunnel capacitor having a third plate and a fourth plate that function as a third gate.

On the other hand, Japanese Patent Application Laid-Open (JP-A) No. 2007-110073 discloses a non-volatile memory cell including: a floating gate electrode disposed extending in a first direction so as to overlap in plan view with a second to a fourth well that are each disposed so as to be enclosed in a first well; a data writing/erasing element formed at a first position, where the floating gate electrode overlaps the second well in plan view; a data reading field effect transistor formed at a second position, where the floating gate electrode overlaps the third well in plan view; and a capacitive element formed at a third position, where the floating gate electrode overlaps the fourth well.

In the semiconductor memory described U.S. Pat. No. 6,788,574, the $p^+$ doped region and the $n^+$ doped region are provided at the periphery of the first plate that configures the coupling capacitor, and the $p^+$ doped region contacts the $n^+$ doped region. Further, contacts are respectively connected to the $p^+$ doped region and the $n^+$ doped region.

However, in cases in which the $p^+$ doped region and the $n^+$ doped region are in contact with each other, a contact 210 may be formed in a region 200 in which the $p^+$ doped region and the $n^+$ doped region overlap, as illustrated in FIG. 1. Such cases may occur due to, for example, misalignment of a mask employed when these doped regions are formed. In the region 200 where the $p^+$ doped region and the $n^+$ doped region, which have comparatively high impurity concentrations, overlap, resistance value becomes high, and thus, responsiveness of the memory cell may decrease in cases in which the contact 210 is connected to the region 200.

SUMMARY

The present disclosure provides a semiconductor memory and a manufacturing method of the semiconductor memory that may suppress occurrence of regions in which a p-type region and an n-type region having comparatively high concentrations overlaps.

A first aspect of the present disclosure is a semiconductor memory including: a first capacitor including, a first diffusion layer having a first type of conductivity, a first conductive layer provided on a surface of the first diffusion layer with a first insulating film interposed therebetween, a second diffusion layer provided at a surface layer portion of the first diffusion layer and has the first type of conductivity, and a third diffusion layer provided at the surface layer portion of the first diffusion layer so as to be adjacent to the first conductive layer and separately from the second diffusion layer, the third diffusion layer having a second type of conductivity different from the first type of conductivity; a second capacitor including, a fourth diffusion layer provided separately from the first diffusion layer, the fourth diffusion layer having the first type of conductivity, a second conductive layer provided on a surface of the fourth diffusion layer with a second insulating film interposed therebetween, the second conductive layer is connected to the first conductive layer, a fifth diffusion layer provided at a surface layer portion of the fourth diffusion layer, the fifth diffusion layer having the first type of conductivity, and a sixth diffusion layer that is provided in the surface layer portion of the fourth diffusion layer so as to be adjacent to the second conductive layer and separated from the fifth diffusion layer, and that has the second type of conductivity; and a transistor including, as a gate electrode, a third conductive layer that is connected to the first conductive layer and the second conductive layer.

A second aspect of the present disclosure is a semiconductor memory manufacturing method including: forming a first capacitor including, a first diffusion layer having a first type of conductivity, a first conductive layer provided on a surface of the first diffusion layer with a first insulating film interposed therebetween, a second diffusion layer provided at a surface layer portion of the first diffusion layer and has the first type of conductivity, and a third diffusion layer provided at the surface layer portion of the first diffusion layer so as to be adjacent to the first conductive layer and separately from the second diffusion layer, the third diffusion layer having a second type of conductivity different from the first type of conductivity; forming a second capacitor including, a fourth diffusion layer provided separately from the first diffusion layer, the fourth diffusion layer having the first type of conductivity, a second conductive layer provided on a surface of the fourth diffusion layer with a second insulating film interposed therebetween, the second conductive layer is connected to the first conductive layer, a fifth diffusion layer provided at a surface layer portion of the fourth diffusion layer, the fifth diffusion layer having the first type of conductivity, and a sixth diffusion layer that is provided in the surface layer portion of the fourth diffusion layer so as to be adjacent to the second conductive layer and separated from the fifth diffusion layer, and that has the second type of conductivity; and forming a transistor including, as a gate electrode, a third conductive layer that is connected to the first conductive layer and the second conductive layer.

According to the above aspects, the present disclosure may provide a semiconductor memory and a manufacturing method of the semiconductor memory that may suppress occurrence of regions in which a p-type region and an n-type region having comparatively high concentrations overlaps.

BRIEF DESCRIPTION OF THE DRAWINGS

Exemplary embodiments will be described in detail based on the following figures, wherein.

DETAILED DESCRIPTION

Figure 1:
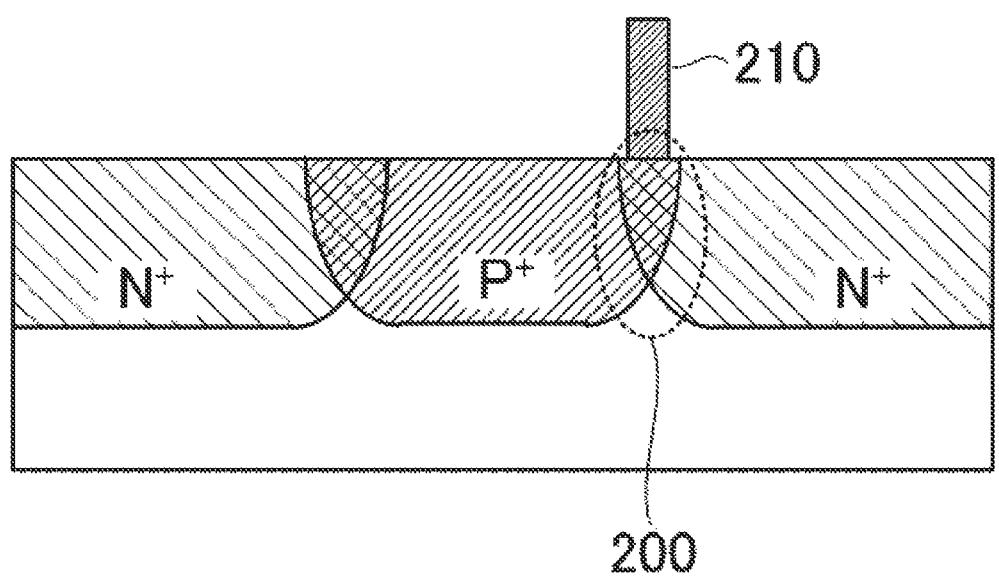
FIG. 1 is a cross-sectional view illustrating a state in which a contact has been formed in a region where a $p^+$ doped region and an $n^+$ doped region overlap.

An example of an exemplary embodiment of the present disclosure is described below, with reference to the drawings. Note that in each of the drawings, the same reference numeral is allocated to configuration elements and portions that are the same or equivalent.

Figure 2:
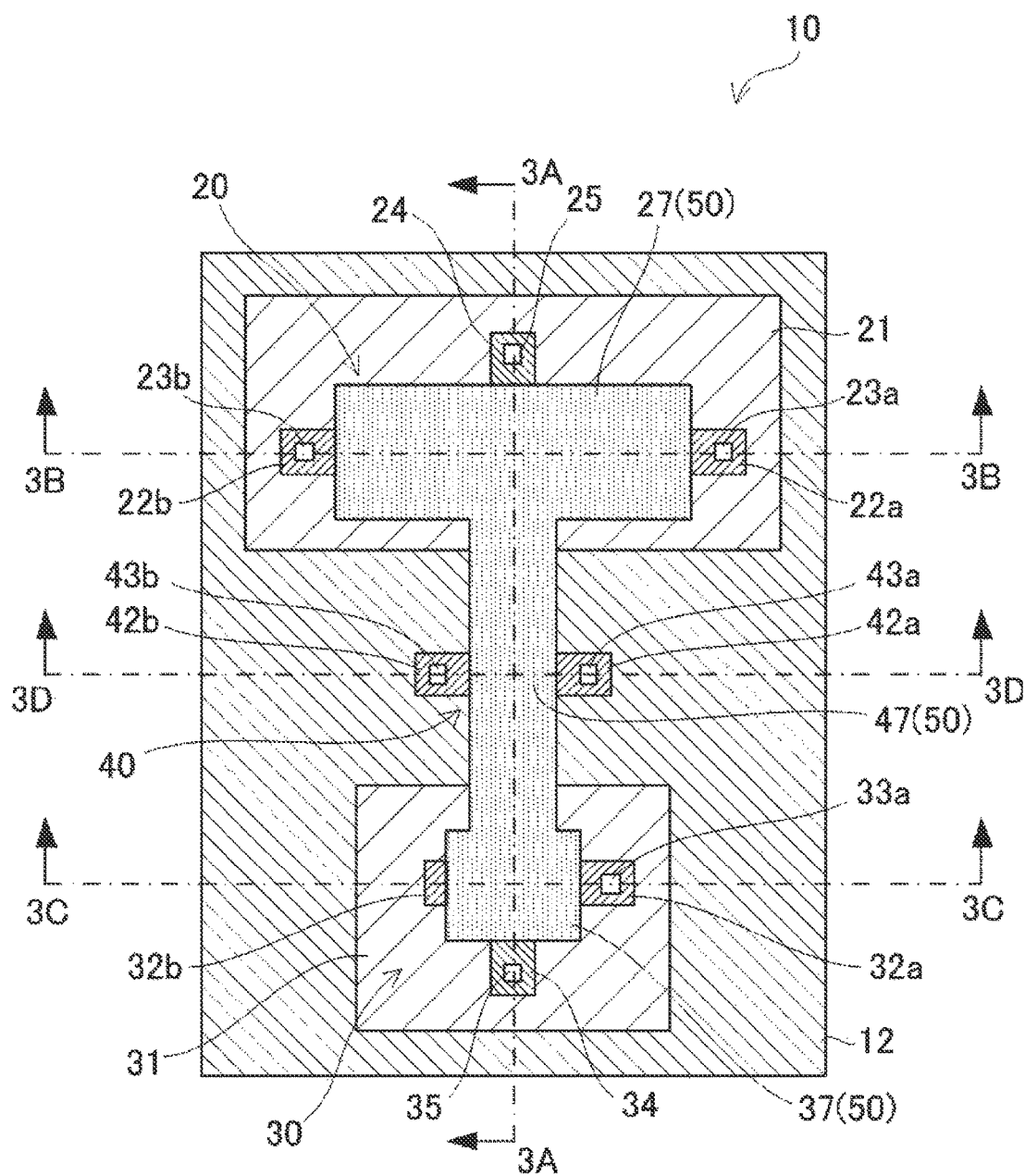
FIG. 2 is a plan view of a memory cell configuring a semiconductor memory according to an exemplary embodiment of the present disclosure.

FIG. 2 is a plan view of a memory cell 10 that configures a semiconductor memory according to an exemplary embodiment of the present disclosure. FIG. 3A, FIG. 3B, FIG. 3C, and FIG. 3D are cross-sectional views taken along line 3A-3A, line 3B-3B, line 3C-3C, and line 3D-3D in FIG. 2, respectively.

The memory cell 10 configures EEPROM in which a floating gate and a control gate are configured by a single layer of a polysilicon film. The memory cell 10 is configured including a first capacitor 20, a second capacitor 30, and a transistor 40. A first conductive layer 27 configuring an upper electrode of the first capacitor 20, a second conductive layer 37 configuring an upper electrode of the second capacitor 30, and a gate electrode 47 of the transistor 40, are formed integrally by a single layer of a polysilicon film 50 and are connected to each other.

As illustrated in FIG. 3A to FIG. 3D, the memory cell 10 includes a silicon substrate 11 and a p-well 12 that is a diffusion layer having p-type electrical conductivity formed in a surface layer portion of the silicon substrate 11. As illustrated in FIG. 2, a surface layer portion of the p-well 12 is provided with n-wells 21 and 31 that are diffusion layers having n-type electrical conductivity formed separated from each other. The first capacitor 20 is provided above the n-well 21 and the second capacitor 30 is provided above the n-well 31.

Figure 3A:
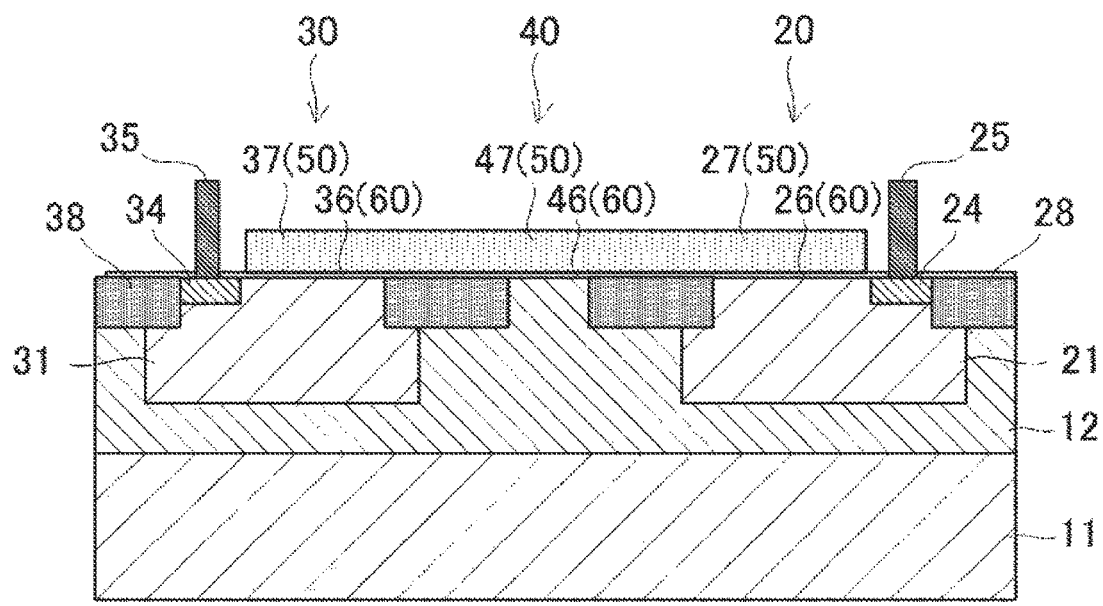
FIG. 3A is a cross-sectional view taken along line 3A-3A in FIG. 2.
Figure 3B:
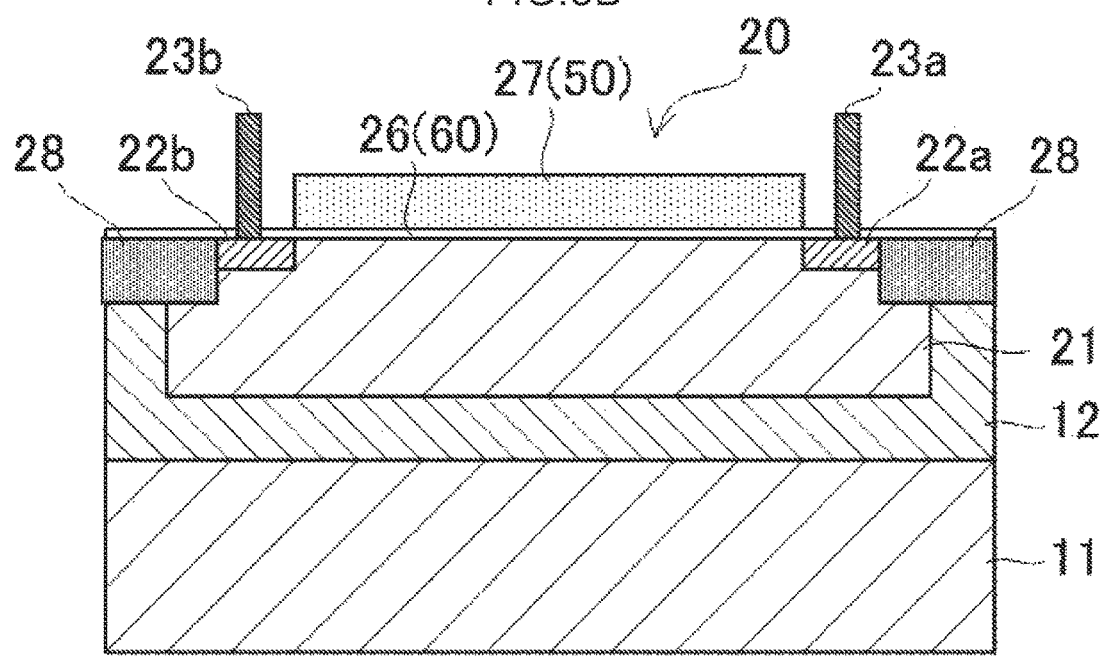
FIG. 3B is a cross-sectional view taken along line 3B-3B in FIG. 2.

FIG. 3A and FIG. 3B illustrate a cross-section structure of the first capacitor 20. The first capacitor 20 is configured including the n-well 21, a first insulating film 26, and a first conductive layer 27. The first insulating film 26 is configured by a silicon oxide film 60 and is provided on the surface of the n-well 21. The first conductive layer 27 is configured by the single layer of polysilicon film 50 and is provided on the surface of the first insulating film 26. The first capacitor 20 includes n-type diffusion layers 22a and 22b provided adjacent to the first conductive layer 27, in a surface layer portion of the n-well 21. The first capacitor 20 further includes a p-type diffusion layer 24 provided adjacent to the first conductive layer 27, in the surface layer portion of the n-well 21. The n-type diffusion layers 22a and 22b and the p-type diffusion layer 24 have higher impurity concentrations than the impurity concentration of the n-well 21.

In the memory cell 10 according to the present exemplary embodiment, the n-type diffusion layers 22a and 22b and the p-type diffusion layer 24 are disposed separated from one another. The first conductive layer 27 has a substantially rectangular shape with plural edges, and the n-type diffusion layers 22a and 22b are provided adjacent to mutually opposing edges of the first conductive layer 27. Further, the n-type diffusion layers 22a and 22b are provided at positions and with sizes so as to not stick out beyond edges of the first conductive layer 27 that are adjacent to the n-type diffusion layers 22a and 22b. Namely, the n-type diffusion layers 22a and 22b are provided at the positions and with the sizes that do not overlap with the edge of the first conductive layer 27 when seen in a plan view. On the other hand, the p-type diffusion layer 24 is provided adjacent to a different edge of the first conductive layer 27 than the edges adjacent to the n-type diffusion layers 22a and 22b. Further, the p-type diffusion layer 24 is provided at a position and with a size so as to not stick out beyond the edge of the first conductive layer 27 that is adjacent to the p-type diffusion layer 24. Namely, the p-type diffusion layer 24 is provided at the position and with the size that does not overlap with the edge of the first conductive layer 27 when seen in a plan view.

The n-type diffusion layers 22a and 22b and the p-type diffusion layer 24 are respectively connected to contacts 23a, 23b, and 25 that are configured by a conductor such as tungsten. An outer peripheral portion of the n-well 21 configuring the first capacitor 20 is, for example, surrounded by an element isolating film 28 configured by an insulator such as SiO$_2$ formed by shallow trench isolation (STI), and the first capacitor 20 is insulated and isolated from the second capacitor 30 and the transistor 40, which are other configuration elements of the memory cell 10.

Figure 3C:
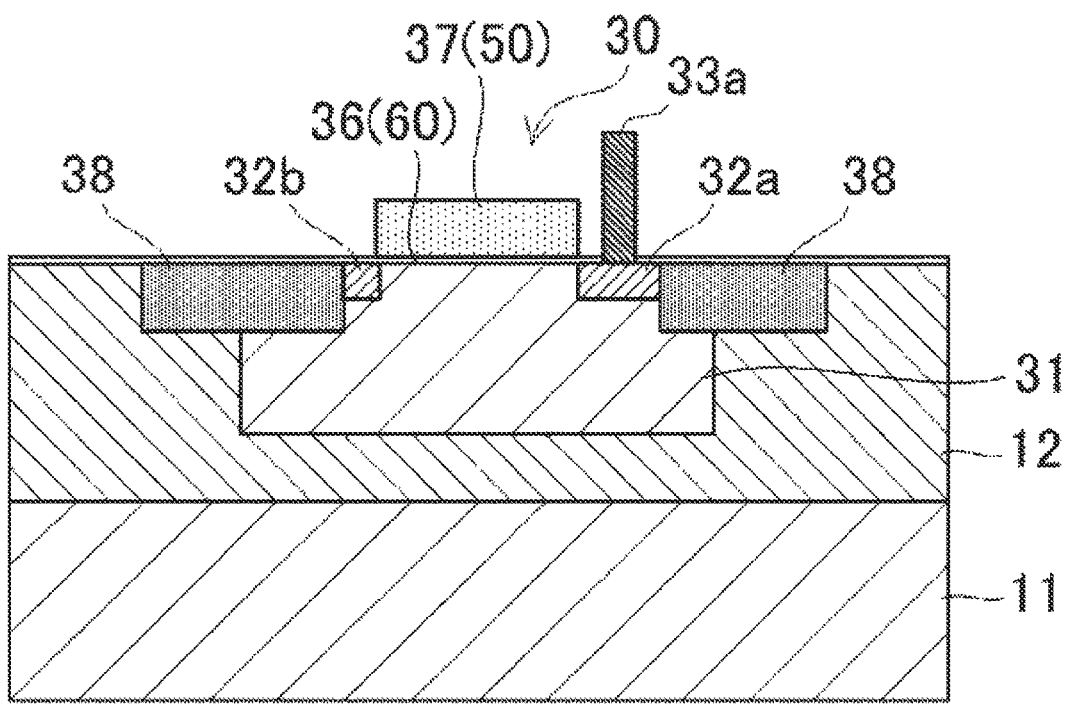
FIG. 3C is a cross-sectional view taken along line 3C-3C in FIG. 2.

FIG. 3A and FIG. 3C illustrate the cross-section structure of the second capacitor 30. The second capacitor 30 is configured including the n-well 31, a second insulating film 36, and the second conductive layer 37. The second insulating film 36 is configured by the silicon oxide film 60 and is provided on the surface of the n-well 31. The second conductive layer 37 is configured by the single layer of polysilicon film 50 and is provided on the surface of the second insulating film 36. Note that the second conductive layer 37 is configured by the polysilicon film 50, which is common to the first conductive layer 27 that configures the first capacitor 20. Accordingly, the second conductive layer 37 is electrically connected to the first conductive layer 27. Similarly, the second insulating film 36 is configured by the silicon oxide film 60, which is common to the first insulating film 26 that configures the first capacitor 20. The second capacitor 30 includes n-type diffusion layers 32a and 32b provided adjacent to the second conductive layer 37, in a surface layer portion of the n-well 31. The second capacitor 30 further includes a p-type diffusion layer 34 provided adjacent to the second conductive layer 37, in the surface layer portion of the n-well 31. The n-type diffusion layers 32a and 32b and the p-type diffusion layer 34 have a higher impurity concentrations than the impurity concentration of the n-well 31.

In the memory cell 10 according to the present exemplary embodiment, the n-type diffusion layers 32a and 32b and the p-type diffusion layer 34 are disposed separated from one another. The second conductive layer 37 has a substantially rectangular shape with plural edges, and the n-type diffusion layers 32a and 32b are provided adjacent to mutually opposing edges of the second conductive layer 37. Further, the n-type diffusion layers 32a and 32b are provided at positions and with sizes so as to not stick out beyond edges of the second conductive layer 37 that are adjacent to the n-type diffusion layers 32a and 32b. Namely, the n-type diffusion layers 32a and 32b are provided at the positions and with the sizes that do not overlap with the edge of the second conductive layer 37 when seen in a plan view. On the other hand, the p-type diffusion layer 34 is provided adjacent to a different edge of the second conductive layer 37 than the edges that are adjacent to the n-type diffusion layers 32a and 32b. Further, the p-type diffusion layer 34 is provided at a position and with a size so as not to stick out beyond the edge of the second conductive layer 37 that is adjacent to the p-type diffusion layer 34. Namely, the p-type diffusion layer 34 is provided at the position and with the size that does not overlap with the edge of the second conductive layer 37 when seen in a plan view.

The n-type diffusion layer 32a and the p-type diffusion layer 34 are respectively connected to contacts 33a and 35 that are configured by a conductor, such as tungsten. An outer peripheral portion of the n-well 31 configuring the second capacitor 30 is, for example, surrounded by an element isolating film 38 configured by an insulator such as SiO$_2$ formed by STI, and the second capacitor 30 is insulated and isolated from the first capacitor 20 and the transistor 40, which are other configuration elements of the memory cell 10.

The surface area of the first conductive layer 27 configuring the first capacitor 20 is greater than the surface area of the second conductive layer 37 configuring the second capacitor 30. Accordingly, the capacitance of the first capacitor 20 is greater than the capacitance of the second capacitor 30.

Figure 3D:
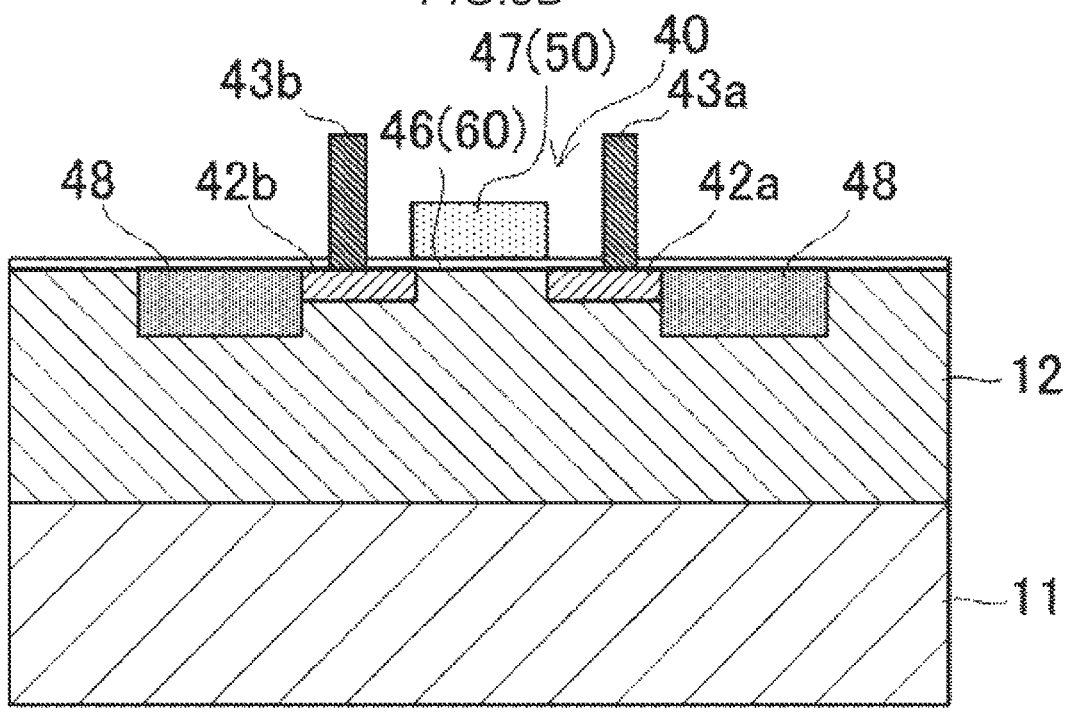
FIG. 3D is a cross-sectional view taken along line 3D-3D in FIG. 2.

As illustrated in FIG. 2, the transistor 40 is provided between the first capacitor 20 and the second capacitor 30. FIG. 3D illustrates the cross-section structure of the transistor 40. The transistor 40 is configured including the p-well 12, a gate insulating film 46, the gate electrode 47, and a source 42a and drain 42b. The gate insulating film 46 is configured by the silicon oxide film 60 and is provided on the surface of the p-well 12. The gate electrode 47 is configured by the single layer of polysilicon film 50 and is provided on the surface of the gate insulating film 46. The source 42a and the drain 42b have n-type conductivity and are provided in the surface layer portion of the p-well 12 with the gate electrode 47 interposed between the source 42a and the drain 42b. Namely, the transistor 40 has an n-channel metal-oxide-semiconductor field-effect transistor (MOSFET) configuration. The gate electrode 47 is configured by the polysilicon film 50, which is common to the first conductive layer 27 that configures the first capacitor 20 and the second conductive layer 37 that configures the second capacitor 30. Accordingly, the gate electrode 47 is electrically connected to the first conductive layer 27 and the second conductive layer 37. Namely, in the memory cell 10, the first conductive layer 27, the second conductive layer 37, and the gate electrode 47 are formed integrally by the single layer of polysilicon film 50. Similarly, the gate insulating film 46 is configured by the silicon oxide film 60, which is common to the first insulating film 26 that configures the first capacitor 20 and the second insulating film 36 that configures the second capacitor 30.

The source 42a and the drain 42b are respectively connected to contacts 43a and 43b that are configured by a conductor such as tungsten. An outer peripheral portion of the transistor 40 is, for example, surrounded by an element isolating film 48 configured by an insulator such as SiO$_2$ formed by STI, and the transistor 40 is insulated and isolated from the first capacitor 20 and the second capacitor 30, which are other configuration elements of the memory cell 10.

In the memory cell 10, the polysilicon film 50 configuring the first conductive layer 27, the second conductive layer 37, and the gate electrode 47 functions as both the control gate and the floating gate. The first capacitor 20 is uses so as to control the voltage of the polysilicon film 50. The second capacitor 30 is a data writing and data erasing capacitor that injects electrons into and releases electrons from the polysilicon film 50 through tunneling. The transistor 40 is a data reading transistor through which a read current flows in accordance with an electron storage state of the polysilicon film 50.

In a case in which electrons are injected into the polysilicon film 50, a high positive voltage is applied to the n-well 21 that configures the first capacitor 20 and a ground potential is applied to the n-well 31 that configures the second capacitor 30. Voltage is applied to the n-well 21 via the contacts 23a and 23b respectively connected to the n-type diffusion layers 22a and 22b, and voltage is applied to the n-well 31 via the contact 33a connected to the n-type diffusion layer 32a.

As described above, the surface area of the first conductive layer 27 that configures the first capacitor 20 is greater than the surface area of the second conductive layer 37 that configures the second capacitor 30. Accordingly, the voltage of the polysilicon film 50 is primarily controlled by the voltage applied to the n-well 21. Namely, the voltage of the polysilicon film 50 follows the voltage applied to the n-well 21.

In a case in which a positive voltage is applied to the n-well 21 in the first capacitor 20, the same positive voltage as that applied to the n-well 21 is also applied to the p-type diffusion layer 24, which functions as a p-type carrier supply source. Applying a positive voltage to the p-type diffusion layer 24 promotes formation of a p-type channel in a region directly below the first conductive layer 27 of the n-well 21, and causes the polysilicon film 50 to control the voltage of the first capacitor 20. Voltage is applied to the p-type diffusion layer 24 via the contact 25 connected to the p-type diffusion layer 24.

The application of a high positive voltage to the polysilicon film 50 in accordance with the voltage applied to the n-well 21 causes a potential difference in the second capacitor 30 between the second conductive layer 37 and the n-well 31, which is applied with the ground potential. Namely, a high voltage is applied across the second insulating film 36 of the second capacitor 30. The potential difference causes Fowler-Nordheim tunneling (FN tunneling) to occur, and electrons are injected into the second conductive layer 37 in the second capacitor 30. Namely, the memory cell 10 adopts a programmed state in which electrons are stored in the polysilicon film 50 functioning as the floating gate.

On the other hand, to release electrons stored in the polysilicon film 50, the ground potential is applied to the n-well 21 that configures the first capacitor 20 and a high positive voltage is applied to the n-well 31 that configures the second capacitor 30. As described above, the voltage of the polysilicon film 50 follows the voltage applied to the n-well 21.

In a case in which a positive voltage is applied to the n-well 31 in the second capacitor 30, the same positive voltage as that applied to the n-well 31 is also applied to the p-type diffusion layer 34, which functions as a p-type carrier supply source. Applying a positive voltage to the p-type diffusion layer 34 promotes formation of a p-type channel in a region directly below the second conductive layer 37 of the n-well 31, such that the production of a tunneling effect in the second capacitor 30 is excellently exhibited.

In the second capacitor 30, a potential difference arises between the second conductive layer 37, which has a potential in the vicinity of the ground potential, and the n-well 31, which is applied with the high positive voltage. This potential difference causes FN tunneling, and releases electrons that had been injected into the second conductive layer 37 (the polysilicon film 50) in the second capacitor 30. Namely, the memory cell 10 adopts an erased state in which the quantity of electrons stored in the polysilicon film 50 functioning as the floating gate is lower than the quantity of electrons stored in the polysilicon film 50 in the programmed state.

The gate threshold voltage of the transistor 40 is relatively high in the programmed state and the gate threshold voltage of the transistor 40 is relatively low in the erased state. The programmed state and the erased state can be distinguished by causing the gate electrode 47 of the transistor 40 to function as the control gate and detecting the current flowing in the transistor 40, thereby achieving memory functionality.

A manufacturing method of the memory cell 10 is described below. FIG. 4A to FIG. 4E and FIG. 5A to FIG. 5J are plan views and cross-sectional views, respectively, illustrating an example of a manufacturing method of the memory cell 10. Note that FIG. 5C is a cross-sectional view taken along line 5C-5C in FIG. 4A. FIG. 5G is a cross-sectional view taken along line 5G-5G in FIG. 4B. FIG. 5H is a cross-sectional view taken along line 5H-5H in FIG. 4C. FIG. 5I is a cross-sectional view taken along line 5I-5I in FIG. 4D. FIG. 5J is a cross-sectional view taken along line 5J-5J in FIG. 4E.

Figure 5A:
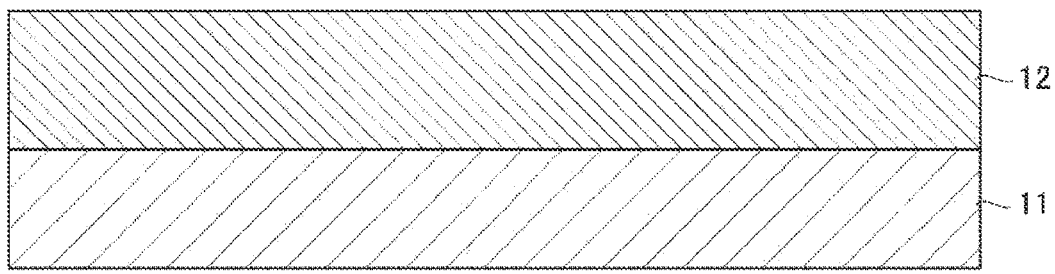
FIG. 5A is a cross-sectional view illustrating a semiconductor memory manufacturing method according to an exemplary embodiment of the present disclosure.

Firstly, the p-well 12, which has p-type conductivity, is formed in the surface layer portion of the silicon substrate 11 using an ion implantation method (FIG. 5A).

Figure 5B:
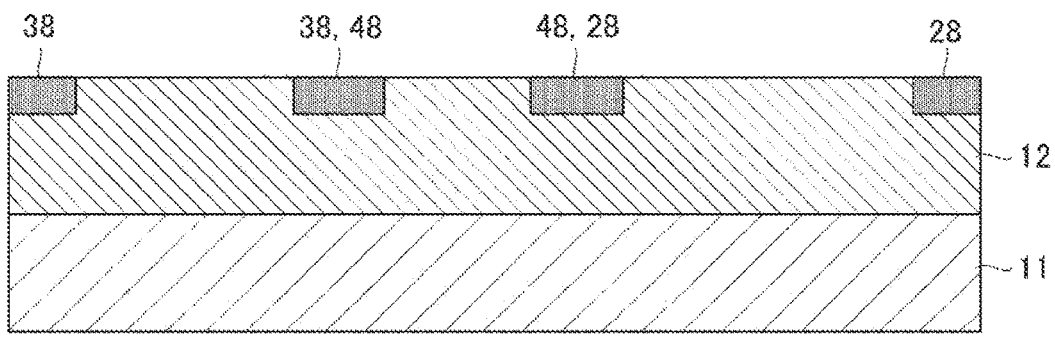
FIG. 5B is a cross-sectional view illustrating a semiconductor memory manufacturing method according to an exemplary embodiment of the present disclosure.

Next, the element isolating films 28, 38, and 48, which are configured by an insulator such as SiO$_2$, are formed in the surface layer portion of the p-well 12 using STI. Namely, a trench is formed in the surface of the p-well 12 by etching, an insulator such as SiO$_2$ is embedded in the trench using chemical vapor deposition (CVD), and the surface of the insulator is planarized using chemical mechanical polishing (CMP), thereby forming the element isolating films 28, 38, and 48. The element isolating films 28, 38, and 48 are formed so as to surround the outer periphery of the first capacitor 20, the second capacitor 30, and the transistor 40 configuring the memory cell 10, thereby insulating and isolating these elements from one another (FIG. 5B).

Next, a resist film 300 is formed on the surface of the p-well 12 and the resist film 300 is patterned using photolithography. Subsequently, arsenic or phosphorous is implanted into the surface of the p-well 12 through the patterned resist film 300 using an ion implantation method.

Figure 4A:
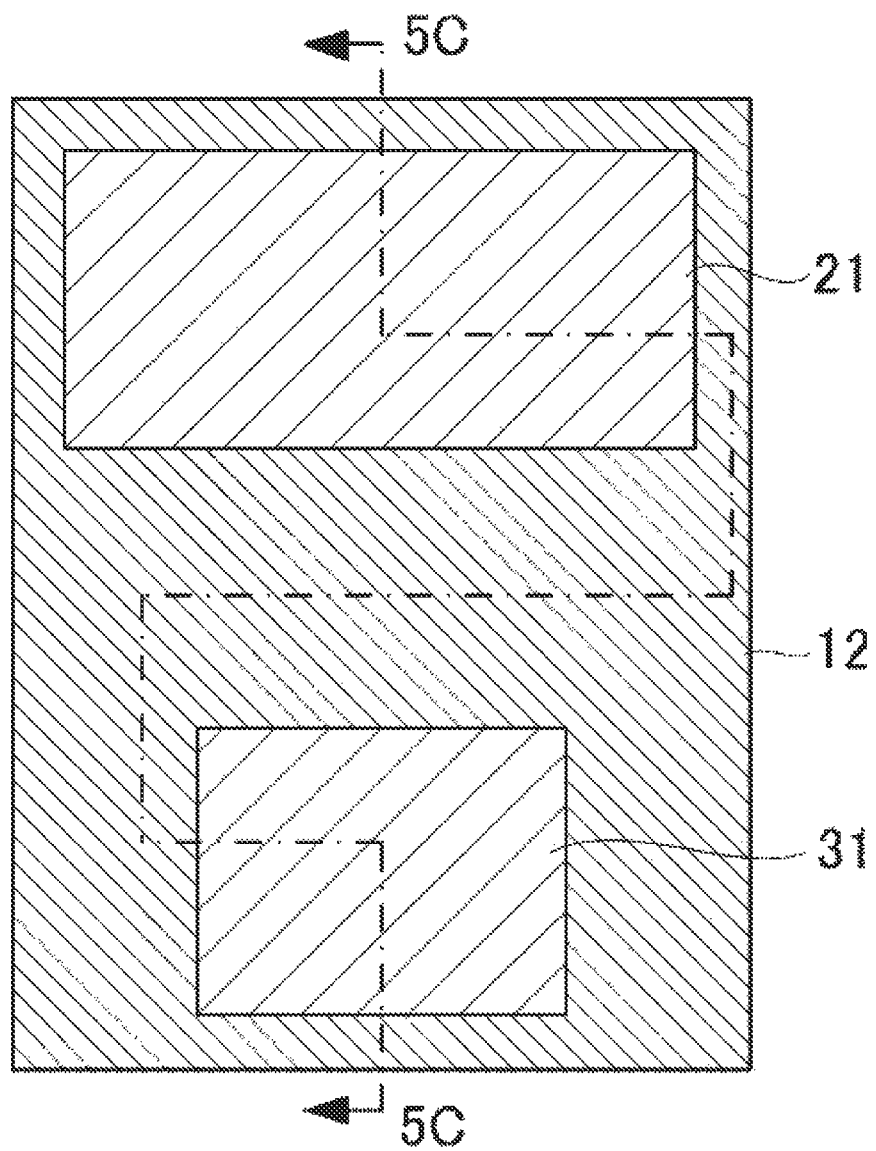
FIG. 4A is a plan view illustrating a semiconductor memory manufacturing method according to an exemplary embodiment of the present disclosure.
Figure 5C:
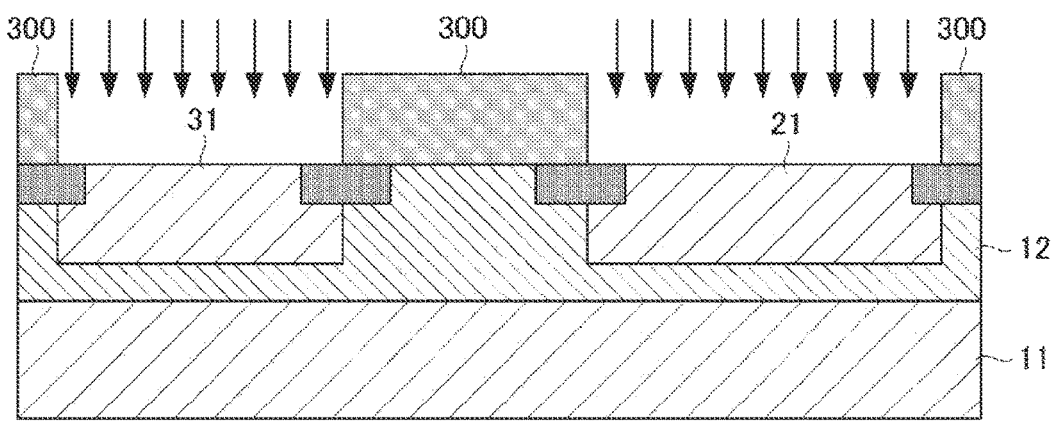
FIG. 5C is a cross-sectional view illustrating a semiconductor memory manufacturing method according to an exemplary embodiment of the present disclosure, and is a cross-sectional view taken along line 5C-5C in FIG. 4A.

This forms the n-wells 21 and 31, which have n-type conductivity, in positions separated from each other in the surface layer portion of the p-well 12 (FIG. 4A, FIG. 5C).

Figure 5D:
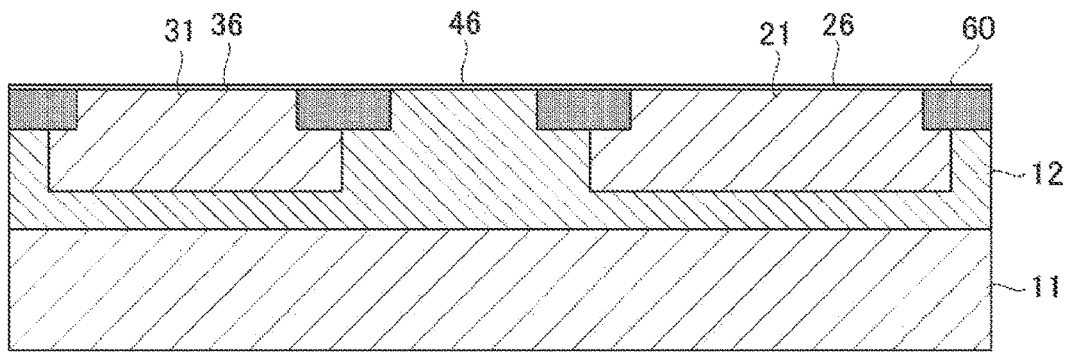
FIG. 5D is a cross-sectional view illustrating a semiconductor memory manufacturing method according to an exemplary embodiment of the present disclosure.

Next, the silicon oxide film 60 is formed integrally covering the surfaces of the p-well 12 and the n-wells 21 and 31 using thermal oxidation. The silicon oxide film 60 configures the first insulating film 26 configuring the first capacitor 20, the second insulating film 36 configuring the second capacitor 30, and the gate insulating film 46 of the transistor 40 (FIG. 5D).

Figure 5E:
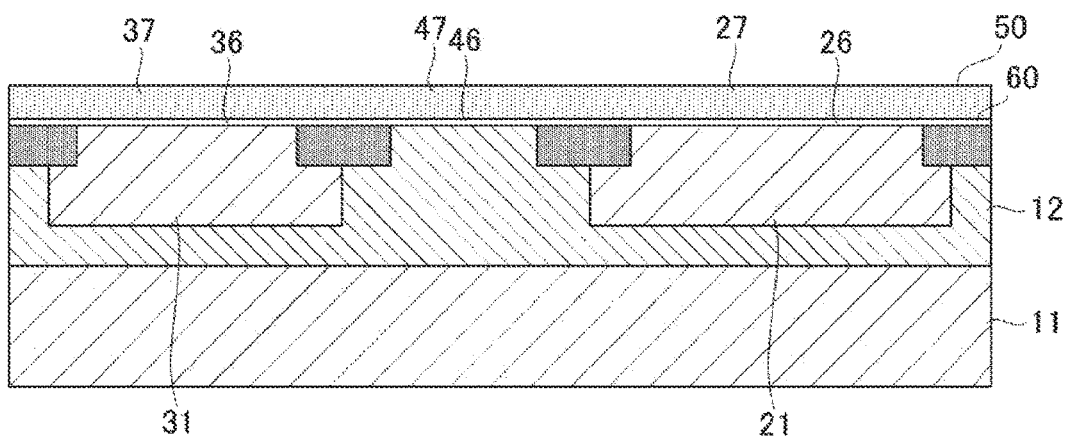
FIG. 5E is a cross-sectional view illustrating a semiconductor memory manufacturing method according to an exemplary embodiment of the present disclosure.
Figure 5F:
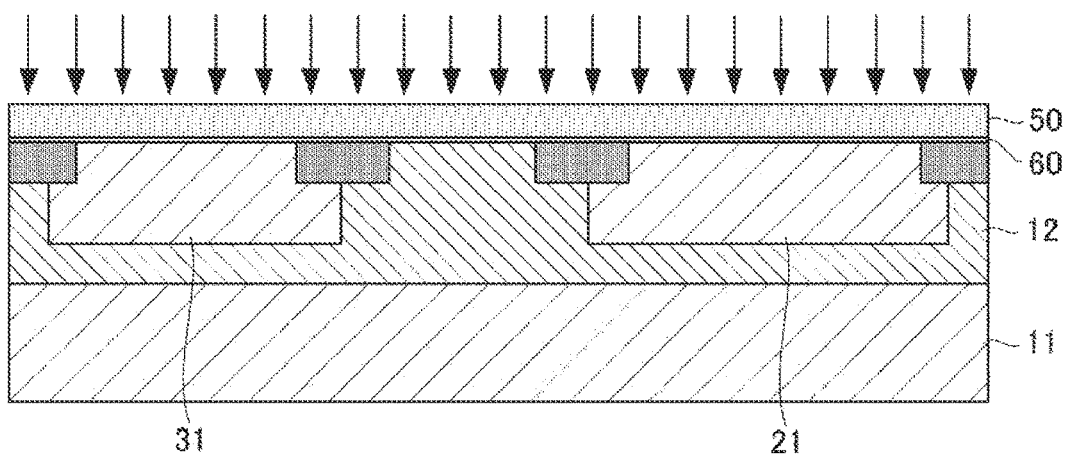
FIG. 5F is a cross-sectional view illustrating a semiconductor memory manufacturing method according to an exemplary embodiment of the present disclosure.
Figure 5G:
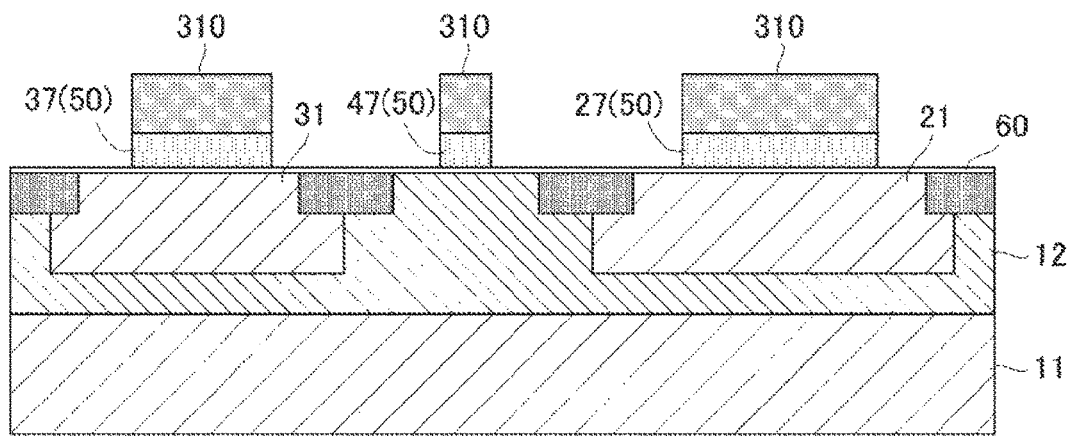
FIG. 5G is a cross-sectional view illustrating a semiconductor memory manufacturing method according to an exemplary embodiment of the present disclosure, and is a cross-sectional view taken along line 5G-5G in FIG. 4B.
Figure 5H:
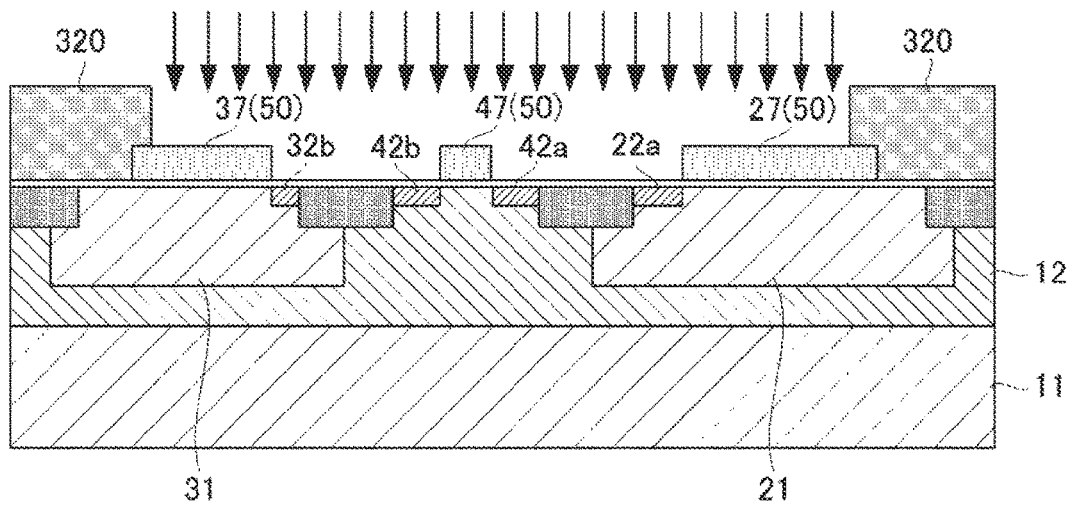
FIG. 5H is a cross-sectional view illustrating a semiconductor memory manufacturing method according to an exemplary embodiment of the present disclosure, and is a cross-sectional view taken along line 5H-5H in FIG. 4C.
Figure 5I:
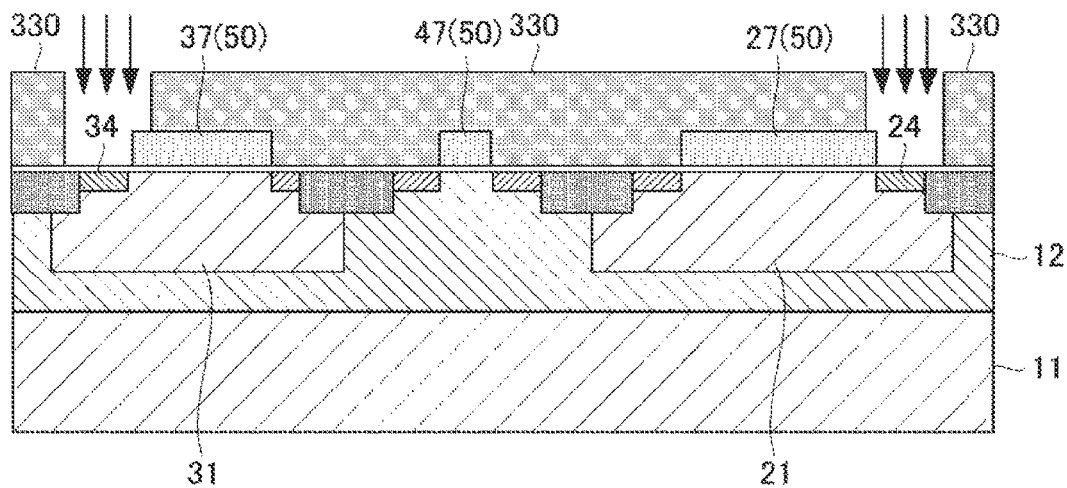
FIG. 5I is a cross-sectional view illustrating a semiconductor memory manufacturing method according to an exemplary embodiment of the present disclosure, and is a cross-sectional view taken along line 5I-5I in FIG. 4D.
Figure 5J:
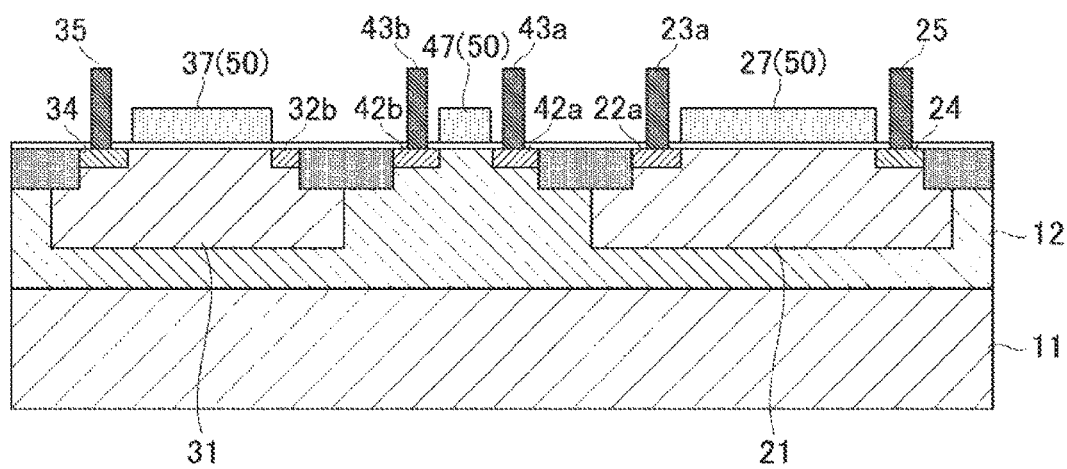
FIG. 5J is a cross-sectional view illustrating a semiconductor memory manufacturing method according to an exemplary embodiment of the present disclosure, and is a cross-sectional view taken along line 5J-5J in FIG. 4E.

Next, the polysilicon film 50 is formed on the surface of the silicon oxide film 60 using CVD (FIG. 5E). Next, phosphorous or arsenic is implanted into the entire surface of the polysilicon film 50 using an ion implantation method. This imparts n-type conductivity to the entire polysilicon film 50 (FIG. 5F).

Figure 4B:
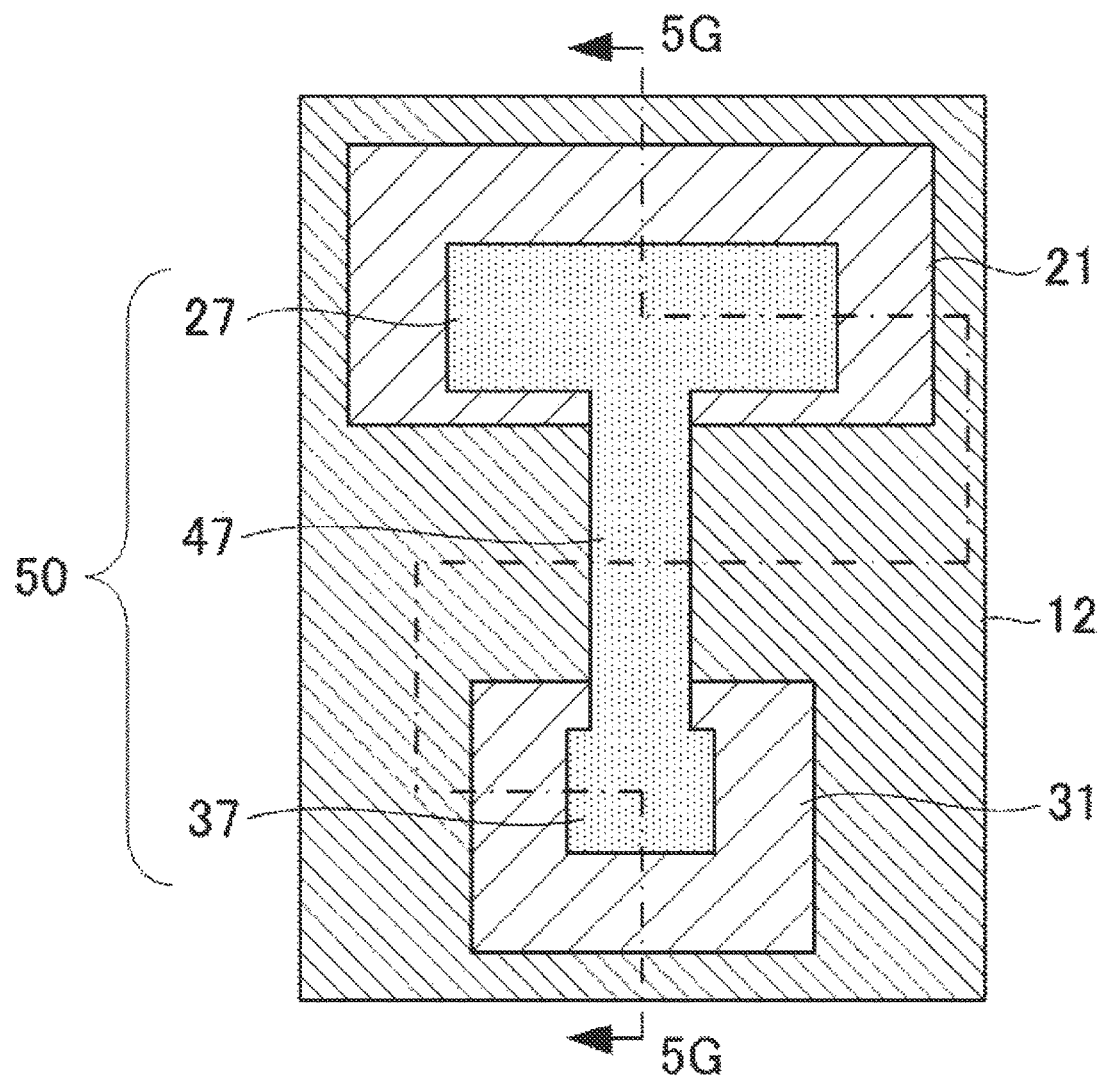
FIG. 4B is a plan view illustrating a semiconductor memory manufacturing method according to an exemplary embodiment of the present disclosure.

Next, a resist film 310 is formed on the surface of the polysilicon film 50 and the resist film 310 is patterned using photolithography. Subsequently, etching is performed using the resist film 310 as a mask so as to pattern the polysilicon film 50. The first conductive layer 27 of the first capacitor 20, the second conductive layer 37 of the second capacitor 30, and the gate electrode 47 of the transistor 40 are configured by the polysilicon film 50 (FIG. 4B, FIG. 5G).

Figure 4C:
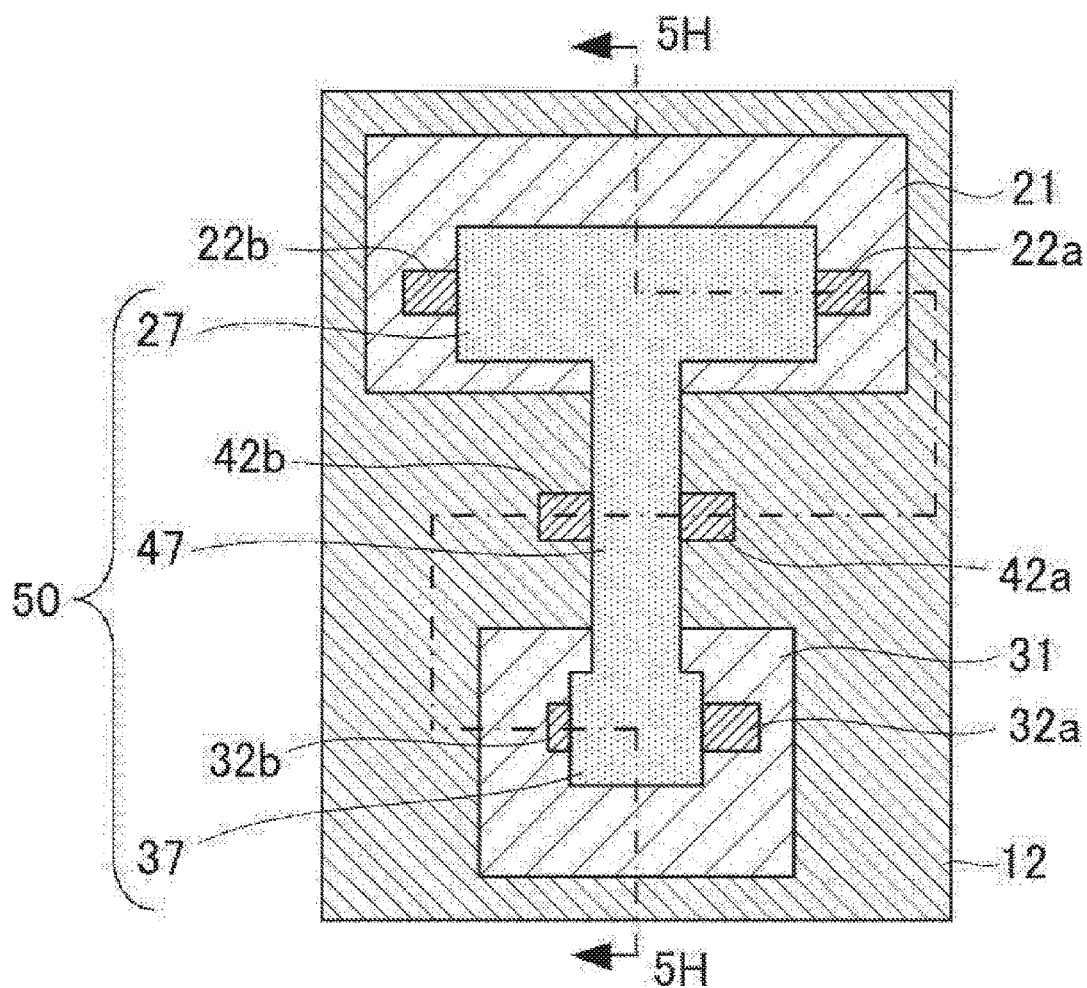
FIG. 4C is a plan view illustrating a semiconductor memory manufacturing method according to an exemplary embodiment of the present disclosure.

Next, a resist film 320 is formed on the surface of the silicon substrate 11 obtained through the processes described above, and the resist film 320 is patterned using photolithography. Subsequently, arsenic or phosphorous is implanted into the surface of the n-wells 21 and 31 through the patterned resist film 320 using an ion implantation method. During ion implantation, the resist film 320, the first conductive layer 27, the second conductive layer 37, and the gate electrode 47 function as masks. Thereby, the n-type diffusion layers 22a and 22b are formed adjacent to the first conductive layer 27 in the surface layer portion of the n-well 21, the n-type diffusion layers 32a and 32b are formed adjacent to the second conductive layer 37 in the surface layer portion of the n-well 31, and the n-type source 42a and drain 42b are formed adjacent to the gate electrode 47 in the surface layer portion of the p-well 12 (FIG. 4C, FIG. 5H).

Figure 4D:
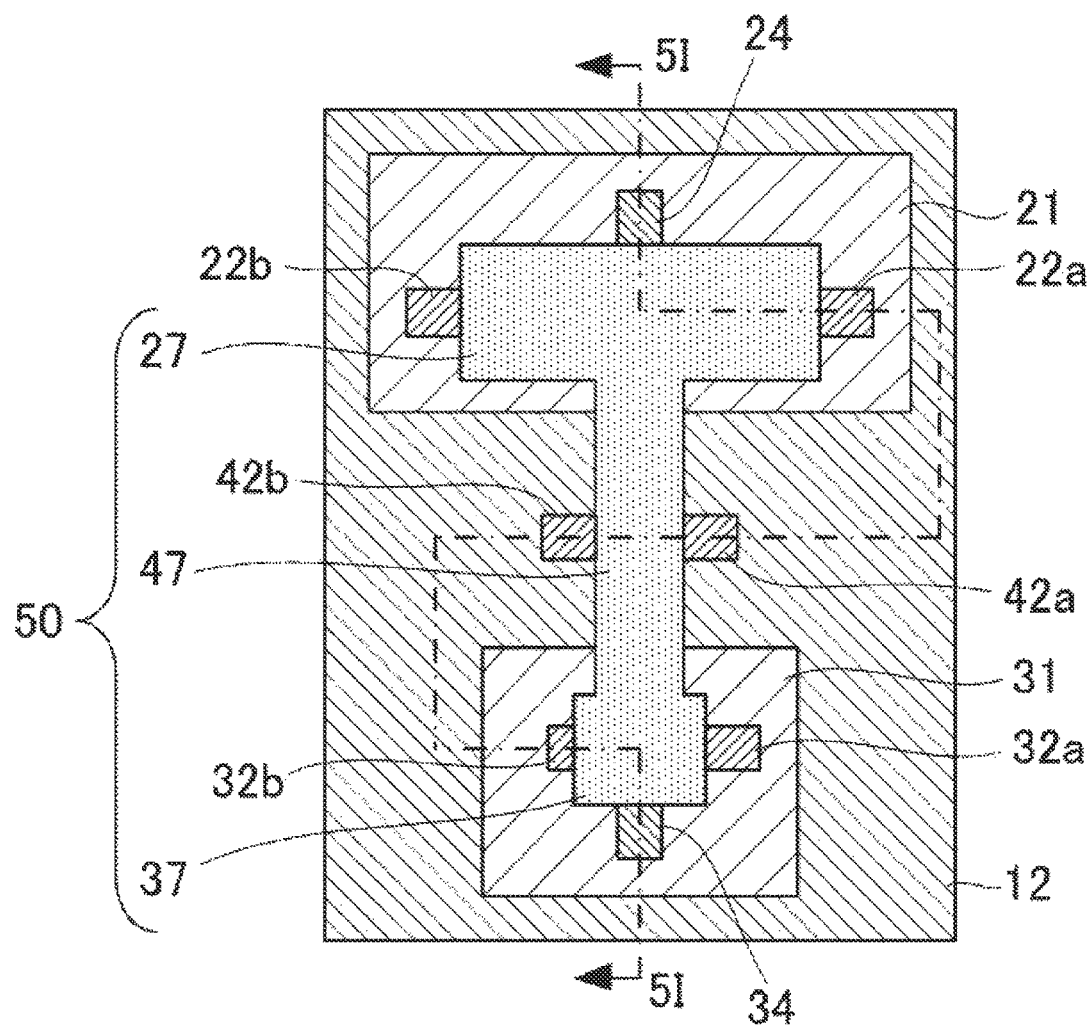
FIG. 4D is a plan view illustrating a semiconductor memory manufacturing method according to an exemplary embodiment of the present disclosure.

Next, a resist film 330 is formed on the surface of the silicon substrate 11 obtained through the processes described above, and the resist film 330 is patterned using photolithography. Subsequently, boron is implanted into the surface of the n-wells 21 and 31 through the patterned resist film 330 using an ion implantation method. During ion implantation, the resist film 330, the first conductive layer 27, and the second conductive layer 37 function as masks. Thereby, the p-type diffusion layer 24 is formed adjacent to the first conductive layer 27 in the surface layer portion of the n-well 21, and the p-type diffusion layer 34 is formed adjacent to the second conductive layer 37 in the surface layer portion of the n-well 31 (FIG. 4D, FIG. 5I).

Figure 4E:
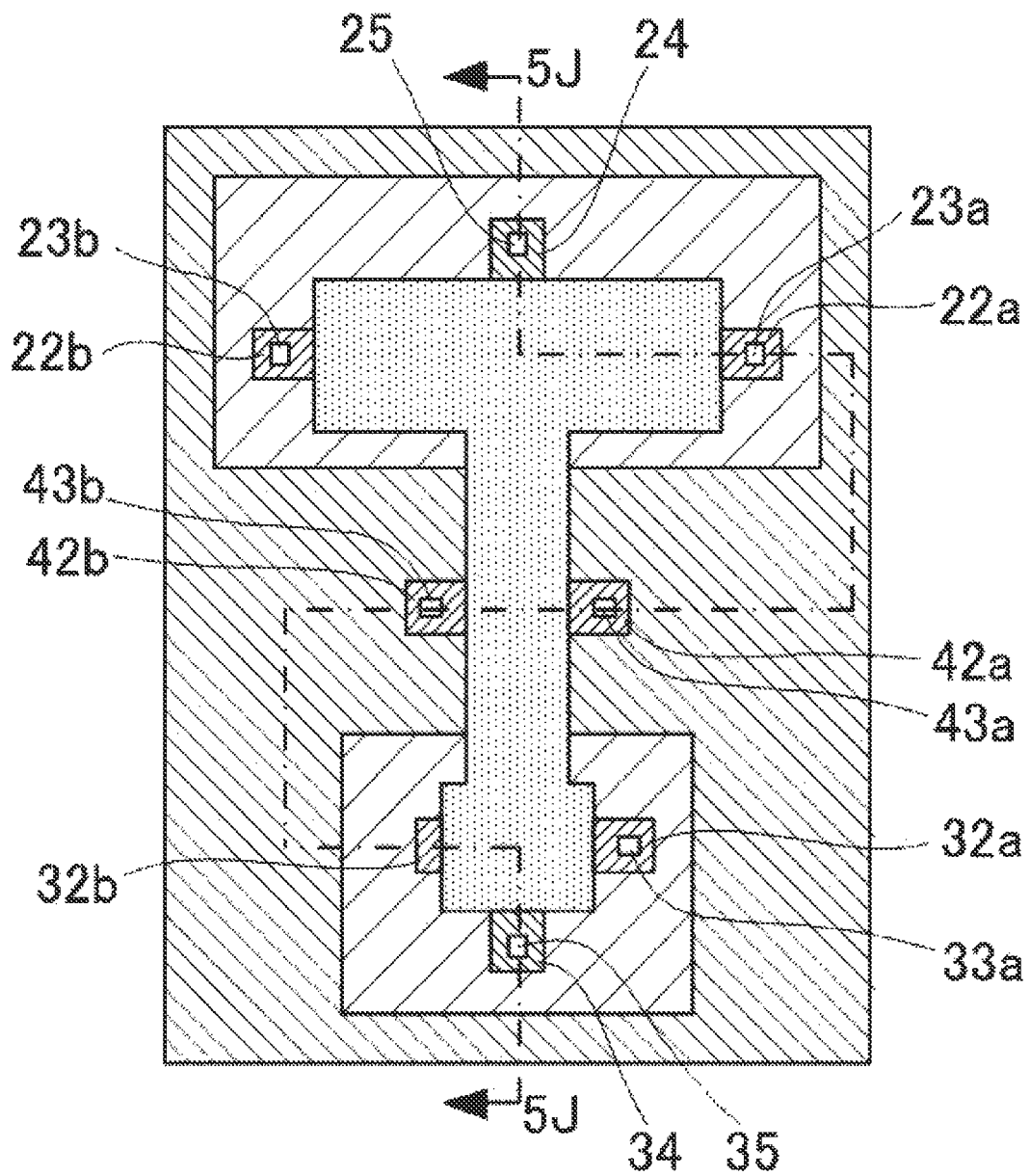
FIG. 4E is a plan view illustrating a semiconductor memory manufacturing method according to an exemplary embodiment of the present disclosure.

Next, an insulating film (not illustrated) configured by an insulator such as $SiO_2$ is formed on the surface of the silicon substrate 11 obtained through the processes described above using CVD, and contact holes are formed in the insulating film. Subsequently, the contact holes are filled with a conductor such as tungsten using CVD. Thereby, the contacts 23a, 23b, and 33a respectively connected to the n-type diffusion layers 22a, 22b, and 32a are formed; the contacts 25 and 35 respectively connected to the p-type diffusion layers 24 and 34 are formed; and the contacts 43a and 43b respectively connected to the source 42a and the drain 42b are formed (FIG. 4E, FIG. 5J).

Figure 6:
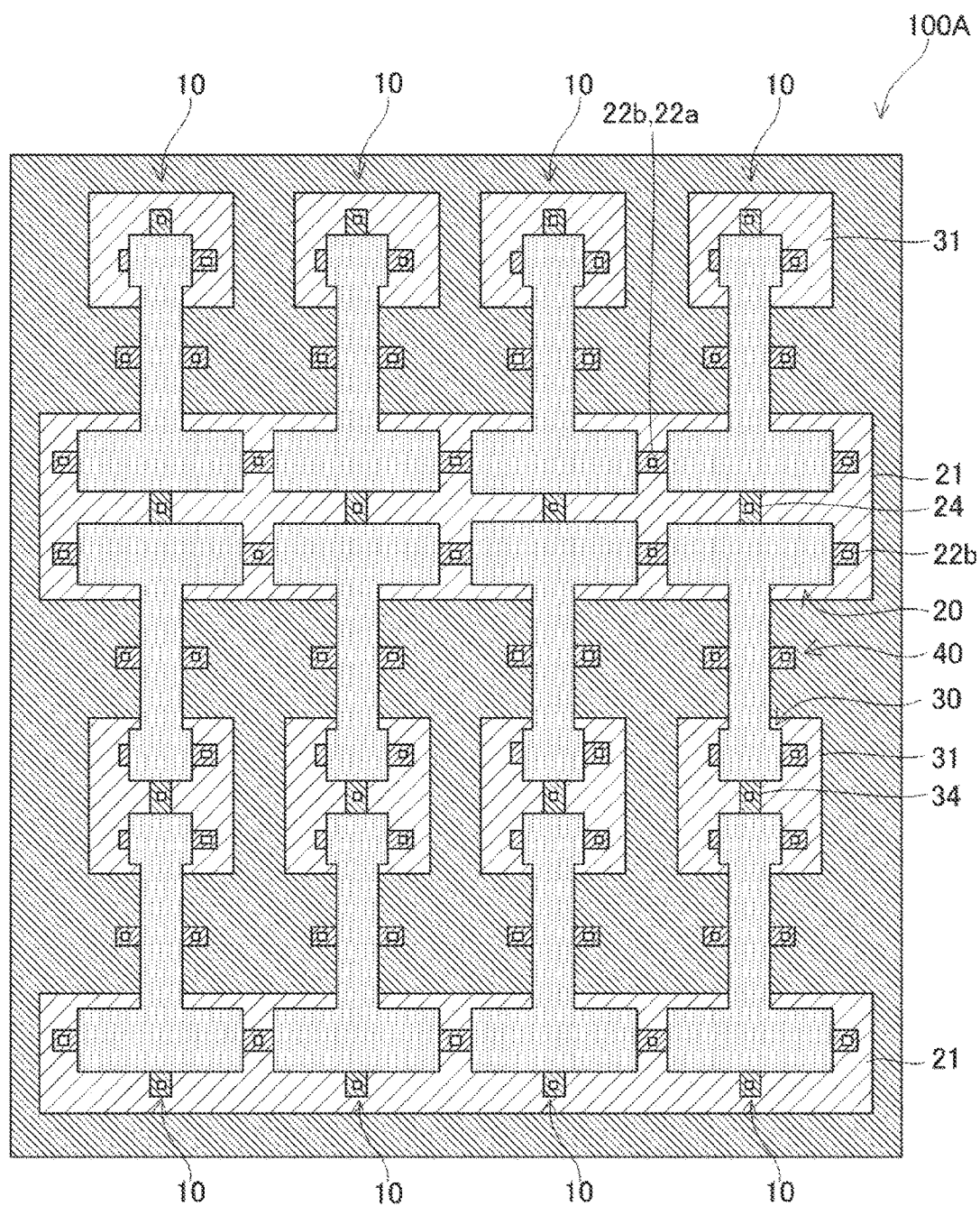
FIG. 6 is a plan view illustrating a configuration of a memory cell array according to an exemplary embodiment of the present disclosure.
Figure 7:
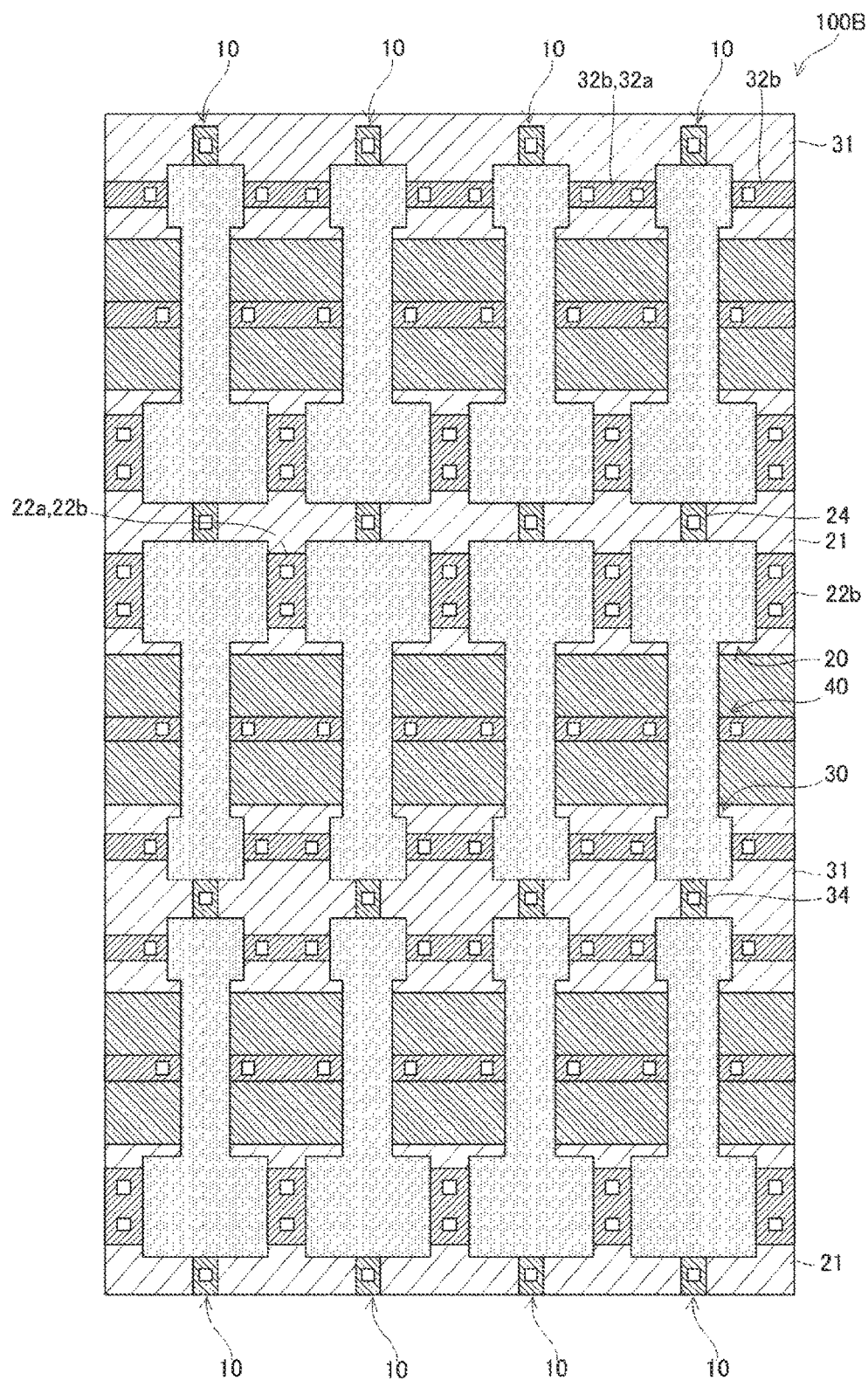
FIG. 7 is a plan view illustrating a configuration of a memory cell array according to an exemplary embodiment of the present disclosure.

FIG. 6 and FIG. 7 are respective plan views of example layouts of memory cell arrays 100A and 100B configured including plural of the memory cells 10. In the memory cell arrays 100A and 100B, the plural memory cells 10 are each configured having n-wells 21 and 31, n-type diffusion layers 22a and 22b, and p-type diffusion layers 24 and 34 that are common to another adjacent memory cell 10. Accordingly, the present exemplary embodiment may reduce the surface area of the memory cell array. In the memory cell array 100B illustrated in FIG. 7, each of the plural memory cells 10 is configured having n-type diffusion layers 32a and 32b and p-type diffusion layer 34 in the second capacitor 30 that are common to another adjacent memory cell 10. Accordingly, the present exemplary embodiment may further reduce the surface area of the memory cell array.

As described above, in the memory cell 10 according to the exemplary embodiment of the present disclosure, the first capacitor 20 includes the n-type diffusion layers 22a and 22b provided adjacent to the first conductive layer 27 in the surface layer portion of the n-well 21, and the p-type diffusion layer 24 that is provided in the surface layer portion of the n-well 21 so as to be adjacent to the first conductive layer 27 and separated from the n-type diffusion layers 22a and 22b. The n-type diffusion layers 22a and 22b and the p-type diffusion layer 24, which have comparatively high impurity concentrations, are thus disposed separated from one another. Accordingly, the exemplary embodiment of the present disclosure may reduce the risk of occurrence of a region in which the n-type diffusion layers 22a and 22b and the p-type diffusion layer 24 overlaps, due to mask misalignment or the like. Furthermore, since the n-type diffusion layers 22a and 22b and the p-type diffusion layer 24 are provided adjacent to different edges of the first conductive layer 27, the risk of occurrence of a region in which the n-type diffusion layers 22a and 22b and the p-type diffusion layer 24 overlaps may be made approximately zero. This may enable a reduction in the risk of the contacts 23a, 23b, and 25 (that are respectively connected to the n-type diffusion layers 22a and 22b and the p-type diffusion layer 24) being connected to a region 200 where an n-type diffusion layer and a p-type diffusion layer overlap, as illustrated in FIG. 1. Accordingly, the exemplary embodiment of the present disclosure may prevent memory performance from being lowered, due to mask misalignment.

Similarly to the first capacitor 20, the second capacitor 30 includes the n-type diffusion layers 32a and 32b provided adjacent to the second conductive layer 37 in the surface layer portion of the n-well 31, and the p-type diffusion layer 34 that is provided in the surface layer portion of the n-well 31 so as to be adjacent to the second conductive layer 37 and separated from the n-type diffusion layers 32a and 32b. The n-type diffusion layers 32a and 32b and the p-type diffusion layer 34, which have comparatively high impurity concentrations, are thus disposed separated from one another. Accordingly, the exemplary embodiment of the present disclosure may reduce the risk of occurrence of a region in which the n-type diffusion layers 32a and 32b and the p-type diffusion layer 34 overlaps, due to mask misalignment or the like. Furthermore, since the n-type diffusion layers 32a and 32b and the p-type diffusion layer 34 are provided adjacent to different edges of the second conductive layer 37, the risk of occurrence of a region in which the n-type diffusion layers 32a and 32b and the p-type diffusion layer 34 overlaps may be made approximately zero. This may enable a reduction in the risk of the contacts 33a, 33b, and 35 (that are respectively connected to the n-type diffusion layers 32a and 32b and the p-type diffusion layer 34) being connected to a region 200 where an n-type diffusion layer and a p-type diffusion layer overlap. as illustrated in FIG. 1. Accordingly, the exemplary embodiment of the present disclosure may prevent memory performance from being lowered, due to mask misalignment.

Further, in the first capacitor 20, the n-type diffusion layers 22a and 22b and the p-type diffusion layer 24 are provided at positions and with sizes so as not to stick out from the edges of the first conductive layer 27 that are adjacent to the n-type diffusion layers 22a and 22b and the p-type diffusion layer 24. Accordingly, the exemplary embodiment of the present disclosure may reduce fluctuations in the capacitance of the first capacitor 20 caused by mask misalignment when forming the n-type diffusion layers 22a and 22b and the p-type diffusion layer 24.

Similarly, in the second capacitor 30, the n-type diffusion layers 32a and 32b and the p-type diffusion layer 34 are provided at positions and with sizes so as not to stick out from the edges of the second conductive layer 37 that are adjacent to the n-type diffusion layers 32a and 32b and the p-type diffusion layer 34. Accordingly, the exemplary embodiment of the present disclosure may reduce fluctuations in the capacitance of the second capacitor 30 caused by mask misalignment when forming the n-type diffusion layers 32a and 32b and the p-type diffusion layer 34.

In the memory cell 10 according to the present exemplary embodiment, FN tunneling is caused by controlling the voltage of the polysilicon film 50 using a capacitance ratio between the first capacitor 20 and the second capacitor 30. It is therefore important to suppress fluctuation in the capacitances of the first capacitor 20 and the second capacitor 30, and to secure accurate capacitances.

According to the manufacturing method of the memory cell 10 of the present exemplary embodiment, after forming the polysilicon film 50 but before forming the n-type diffusion layers 22a, 22b, 32a, and 32b and the p-type diffusion layers 24 and 34, impurities are implanted into the entire surface of the polysilicon film 50. Accordingly, uniform conductivity is imparted to the entirety of the polysilicon film 50 (see FIG. 5F). By thus imparting conductivity to the entirety of the polysilicon film 50 in advance, local changes in the conductivity of the polysilicon film 50 accompanying subsequently performed ion implantation to form the n-type diffusion layers 22a, 22b, 32a, and 32b and the p-type diffusion layers 24 and 34 can be suppressed. In a case in which there is a mixture of p-type regions and n-type regions in the polysilicon film 50, pn junctions are formed in the polysilicon film 50, hindering the polysilicon film 50 from functioning as a capacitor electrode or a gate electrode. Imparting conductivity to the entirety of the polysilicon film 50 in advance enables the polysilicon film 50 to maintain uniform conductivity and enables the formation of pn junctions in the polysilicon film 50 to be avoided, even in a case in which ion implantation is subsequently performed.

Figure 8:
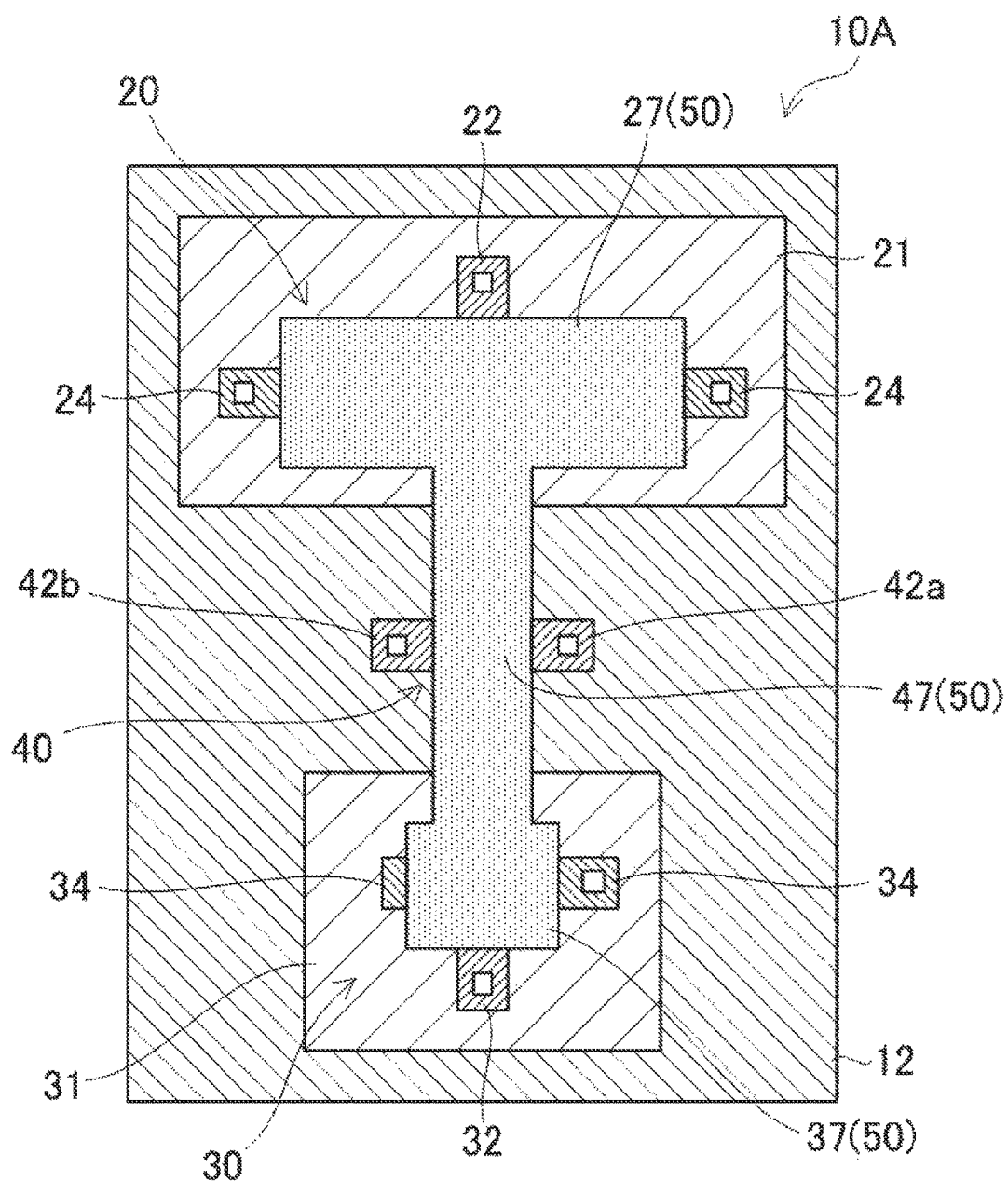
FIG. 8 is a plan view of a memory cell according to another exemplary embodiment of the present disclosure.

Note that the memory cell 10 according to the present exemplary embodiment can be modified as follows. Namely, the placements of the n-type diffusion layers 22a and 22b and the p-type diffusion layer 24 may be changed and the placements of the n-type diffusion layers 32a and 32b and the p-type diffusion layer 34 may be changes with respect to the configuration of the memory cell 10 illustrated in FIG. 2, as in a memory cell 10A illustrated in FIG. 8. According to the memory cell 10A illustrated in FIG. 8, configuration is such that a p-type region (the p-type diffusion layer 24), an n-type region (the source 42a and the drain 42b), and a p-type region (the p-type diffusion layer 34) are in a row in this sequence along the length direction of the polysilicon film 50 (a direction in which the first capacitor 20, the transistor 40, and the second capacitor 30 are in a row). In a case in which p-type regions and n-type regions are alternatingly disposed along the length direction of the polysilicon film 50, imparting conductivity to the entirety of the polysilicon film 50 in advance as described above is particularly effective for avoiding the formation of pn junctions in the polysilicon film 50. On the other hand, according to the configuration of the memory cell 10 illustrated in FIG. 2, configuration is such that an n-type region (the n-type diffusion layers 22a and 22b), an n-type region (the source 42a and the drain 42b), and an n-type region (the n-type diffusion layers 32a and 32b) are in a row along the length direction of the polysilicon film 50. Since pn junctions are not formed in the polysilicon film 50 in cases in which a region of identical conductivity is continuous along the length direction of the polysilicon film 50, the process of imparting conductivity to the entirety of the polysilicon film 50 in advance (see FIG. 5F) may be omitted.

Figure 9:
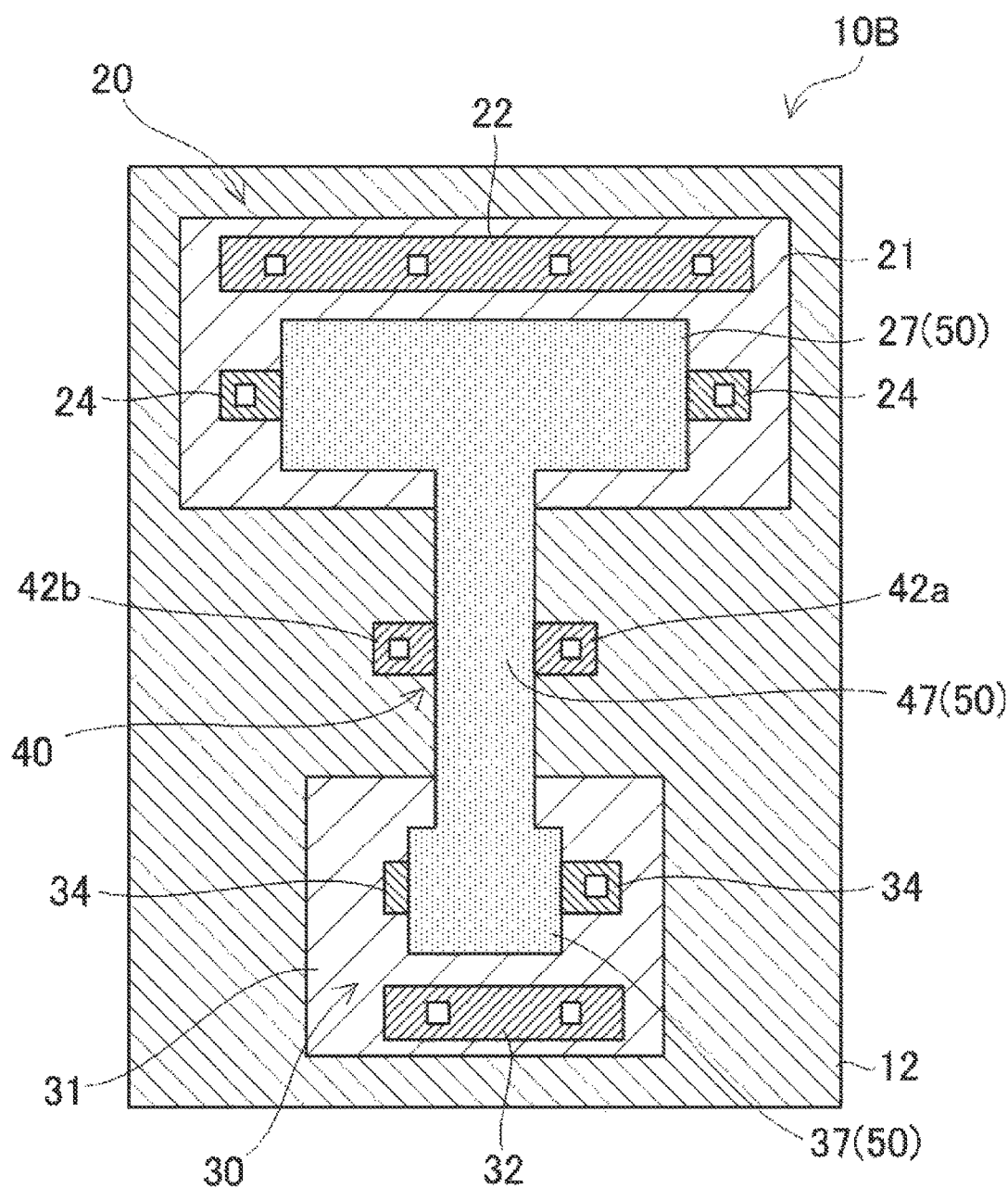
FIG. 9 is a plan view of a memory cell according to another exemplary embodiment of the present disclosure.

Further, in the exemplary embodiment above, a case in which the n-type diffusion layers 22a and 22b are provided adjacent to the first conductive layer 27 and the n-type diffusion layers 32a and 32b are provided adjacent to the second conductive layer 37, has been described. However, an n-type diffusion layer 22 may be provided separated from the first conductive layer 27, and an n-type diffusion layer 32 may be provided separated from the second conductive layer 37, as in a memory cell 10B illustrated in FIG. 9.

Further, in the present exemplary embodiment, a case in which the first conductive layer 27, the second conductive layer 37, and the gate electrode 47 are configured by a polysilicon film, has been described. However, the first conductive layer 27, the second conductive layer 37, and the gate electrode 47 may be configured by another material having conductivity. Further, in the present exemplary embodiment, a case in which the first insulating film 26, the second insulating film 36, and the gate insulating film 46 are configured by a silicon oxide film, has been described. However, the first insulating film 26, the second insulating film 36, and the gate insulating film 46 may be configured by another material having insulating properties.

Note that the n-well 21 is an example of a first diffusion layer of the present disclosure. The n-type diffusion layers 22a and 22b are examples of a second diffusion layer of the present disclosure. The p-type diffusion layer 24 is an example of a third diffusion layer of the present disclosure. The first insulating film 26 is an example of a first insulating film of the present disclosure. The first conductive layer 27 is an example of a first conductive layer of the present disclosure. The first capacitor 20 is an example of a first capacitor of the present disclosure. The n-well 31 is an example of a fourth diffusion layer of the present disclosure. The n-type diffusion layers 32a and 32b are examples of fifth diffusion layers of the present disclosure. The p-type diffusion layer 34 is an example of a sixth diffusion layer of the present disclosure. The second insulating film 36 is an example of a second insulating film of the present disclosure. The second conductive layer 37 is an example of a second conductive layer of the present disclosure. The second capacitor 30 is an example of a second capacitor of the present disclosure. The gate electrode 47 is an example of a third conductive layer of the present disclosure. The transistor 40 is an example of a transistor of the present disclosure.

What is claimed is:
1. A semiconductor memory comprising:
a first capacitor including,
a first diffusion layer having a first type of conductivity, a first conductive layer provided on a surface of the first diffusion layer with a first insulating film interposed therebetween, a second diffusion layer provided at a surface layer portion of the first diffusion layer and has the first type of conductivity, and a third diffusion layer provided at the surface layer portion of the first diffusion layer so as to be adjacent to the first conductive layer and separately from the second diffusion layer, the third diffusion layer having a second type of conductivity different from the first type of conductivity;

a second capacitor including, a fourth diffusion layer provided separately from the first diffusion layer, the fourth diffusion layer having the first type of conductivity, a second conductive layer provided on a surface of the fourth diffusion layer with a second insulating film interposed therebetween, the second conductive layer is connected to the first conductive layer, a fifth diffusion layer provided at a surface layer portion of the fourth diffusion layer, the fifth diffusion layer having the first type of conductivity, and a sixth diffusion layer that is provided in the surface layer portion of the fourth diffusion layer so as to be adjacent to the second conductive layer and separated from the fifth diffusion layer, and that has the second type of conductivity; and a transistor including, as a gate electrode, a third conductive layer that is connected to the first conductive layer and the second conductive layer.

2. The semiconductor memory of claim 1, further comprising contacts, formed of conductors, that are respectively connected to the second diffusion layer, the third diffusion layer, the fifth diffusion layer, and the sixth diffusion layer.

3. The semiconductor memory of claim 1, wherein:
the second diffusion layer is provided adjacent to the first conductive layer; and
the fifth diffusion layer is provided adjacent to the second conductive layer.

4. The semiconductor memory of claim 1, wherein:
the impurity concentrations of the second diffusion layer and the third diffusion layer are higher than the impurity concentration of the first diffusion layer; and
the impurity concentrations of the fifth diffusion layer and the sixth diffusion layer are higher than the impurity concentration of the fourth diffusion layer.

5. The semiconductor memory of claim 1, wherein the first conductive layer, the second conductive layer, and the third conductive layer are formed integrally by a single silicon polysilicon film.

6. The semiconductor memory of claim 5, wherein the polysilicon film has a single type of conductivity.

7. The semiconductor memory of claim 1, wherein the surface area of the first conductive layer is greater than the surface area of the second conductive layer.

8. The semiconductor memory of claim 1, wherein:
the first conductive layer and the second conductive layer each have plural edges;
the second diffusion layer and the third diffusion layer are provided adjacent to different edges of the first conductive layer; and
the fifth diffusion layer and the sixth diffusion layer are provided adjacent to different edges of the second conductive layer.

* * * * *